United States Patent
Higashijima

[11] Patent Number: 5,175,882
[45] Date of Patent: Dec. 29, 1992

[54] DEMODULATION CONTROL ARRANGEMENT IN SATELITTE COMMUNICATIONS SYSTEM USING "SCPC-DAMA"

[75] Inventor: Satoru Higashijima, Tokyo, Japan

[73] Assignee: NEC Corporation, Tokyo, Japan

[21] Appl. No.: 626,744

[22] Filed: Dec. 13, 1990

[30] Foreign Application Priority Data

Dec. 14, 1989 [JP] Japan .................................. 1-322584

[51] Int. Cl.$^5$ .............................................. H04B 1/16
[52] U.S. Cl. .............................. 455/234.1; 455/249.1; 455/251.1
[58] Field of Search ..................... 455/3.2, 200.1, 234.1, 455/234.2, 239.1, 240.1, 241.1, 249.1, 251.1; 358/174, 184; 375/98

[56] References Cited

U.S. PATENT DOCUMENTS 4,330,859  5/1982  Takada ............................. 455/251.1
4,553,105  11/1985  Sasaki ............................... 455/249.1

Primary Examiner—Reinhard J. Eisenzopf
Assistant Examiner—Chi H. Pham
Attorney, Agent, or Firm—Laff, Whitesel, Conte & Saret

[57] ABSTRACT

In order to effectively demodulate an incoming RF signal which takes the form of bursts in a satelitte communications system using a Single Channel Per Carrier Demand Assigned Multiple Access (SCPC-DAMA) technique, a controller is provided which is operatively coupled to a down-converter and a demodulating section. In the event that the RF signal is a continuous signal, the controller routes an AGC signal, which is outputted from the demodulating section, to a first variable attenuator provided in the down-converter and applies a constant potential to a second variable attenuator within the demodulating section. On the other hand, in the event that the RF signal assumes the burst format, the controller retains a value of the AGC signal at the time when the RF signal undergoes the continuous-burst change and applies the retained value of the AGC signal to the first variable attenuator. The controller further allows the AGC signal to be applied to the variable attenuator while the RF signal takes the form of the bursts.

2 Claims, 3 Drawing Sheets

DEMODULATION CONTROL ARRANGEMENT IN SATELITTE COMMUNICATIONS SYSTEM USING "SCPC-DAMA"

BACKGROUND OF THE INVENTION

1. Field of the Invention

The present invention relates to a control arrangement for demodulating an incoming radio frequency signal transmitted via a satellite, and more specifically to such an arrangement using Single Channel Per Carrier Demand Assigned Multiple Access (SCPC-DAMA) techniques.

2. Description of the Prior Art

It is known in the art that the SCPC-DAMA is an important variation of an FDMA (Frequency Division Multiple Access) technique. The terminology SCPC refers to the fact that each carrier is modulated by a bit stream representing a single user's voice channel. The SCPC is suited for a satellite communications system which comprises a number of small scale earth stations.

The SCPC carriers in the demand assignment (viz., DAMA) are voice-activated such that carrier power is turned on only during time intervals when the voice envelope exceeds a threshold level. More specifically, in the demand assignment, all channels are previously pooled so that any pair of earth stations may set up satellite circuits using idle channels in a burst mode when a traffic demand arises. When calls are terminated, the channels are released back to the pool, and the traffic demand waiting earth stations communicates with each other through continuous signals instead of bursts.

To accommodate the voice activation of the carrier, each PSK (Phase Shift Keying) demodulator (for example) provided in a receive terminal must rapidly acquire the beginning of each speech segment (viz., burst). If this is not done, an initial portion of the burst will be lost.

A prior art demodulator, which is used in the SCPC in the demand assignment mode, will be discussed with reference to FIG. 1.

The FIG. 1 arrangement comprises a down-converter 10 interconnected with a demodulating section 12. The down-converter 10 includes a voltage controlled attenuator 14 to which an incoming radio frequency (RF) signal is applied via an input terminal 16, a mixer 18 operatively coupled to a local oscillator 20, and an amplifier 22. On the other hand, the demodulating section 12 includes a fixed attenuator 24, a coherent demodulator 26, a carrier and clock recovery circuit 28, and a level detector 30.

The RF signal takes the form of a PSK (phase shift keying) modulated signal (for example), and is applied to the voltage controlled attenuator 14 via the terminal 16. The attenuator 14 reduces the amplitude of the RF signal under the control of an AGC (automatic gain control) signal 51 applied thereto from the level detector 30. The output of the attenuator 14 undergoes mixing at the next stage including the mixer 18 and the local oscillator 20. A modulated IF (intermediate frequency) signal is outputted from the down-converter 10 after being amplified at the amplifier 22.

The output of the down-converter 10 is then applied, via the fixed attenuator 24, to the coherent demodulator 26 and to the carrier and clock recovery circuit 28. The coherent demodulator 26 is supplied with a recovered carrier Rcr and a recovered clock Rclk, and synchronously demodulates the IF signal in a known manner and generates a demodulated baseband signal through an output terminal 32. The level detector 30 receives an analog baseband signal from a portion (not shown) forming part of the demodulator 26 and detects the level of the signal applied, and then supplies the attenuator 14 with the output thereof as the AGC signal 51.

The signal level of the incoming RF signal is undesirably lowered or changed due to the following reasons: transmission loss over a cable extending from the input terminal 16 to an outdoor unit (not shown), non-uniformity of gains of RF amplifiers which precede the converter 10, etc. In order to compensate for the undesirable level changes in the incoming RF signal, the variable attenuator 14 is provided with a relatively wide dynamic range (about 40 dB for example). However, this wide dynamic range adversely affects a quick response of the AGC loop shown in FIG. 1.

In the event that the FIG. 1 arrangement is applied to a satellite communications system in which the SCPC in the demand assignment mode is employed, the down-converter 10 is supplied with a continuous RF signal during a time period in the absence of voice activation, while being supplied with burst signals when voice-activated. As referred to in the above, to accommodate the voice activation of the carrier, the coherent demodulator 26 must acquire rapidly the beginning of each of the consecutively transmitted bursts.

As also previously mentioned, the voltage controlled attenuator 14 should have a relatively wide dynamic range (e.g. 40 dB) in order to compensate for the undesirable level deviations in the incoming RF signal, and hence the response of the AGC loop is rendered undesirably slow. Accordingly, the coherent demodulator 24 may fail to demodulate an initial portion of each of the bursts which are successively transmitted. It should be noted that the dynamic range of the fixed attenuator 24 is narrow (about 5 dB for example), so that the insertion of the attenuator 24 in the AGC loop does not adversely affect the AGC loop response. Further, it should be noted that the demodulation of a continuous RF signal is normally implemented with the arrangement shown in FIG. 1.

In addition to the above problems inherent in the prior art, the slow response in the AGC loop is unable to compensate for burst interval deviations which are caused by transmission power differences between the earth stations.

SUMMARY OF THE INVENTION

It is an object of the present invention to provide a control arrangement for effectively demodulating a burst signal in a satellite communications system wherein the SCPC-DAMA is utilized.

In brief, the above object is achieved by an arrangement wherein a controller is provided which is operatively coupled to a down-converter and a demodulating section. In the event that an incoming RF signal is a continuous signal, the controller routes an AGC signal, which is outputted from the demodulating section, to a first variable attenuator provided in the down-converter and applies a constant potential to a second variable attenuator within the demodulating section. On the other hand, in the event that the RF signal comes in bursts, the controller retains a value of the AGC signal at the time when the RF signal undergoes the continuous-burst change and applies the retained value of the AGC signal to the first variable attenuator. The controller further allows the AGC signal to be applied to the variable attenuator while the RF signal takes the form of the bursts.

More specifically, an aspect of the present invention comes in an arrangement for demodulating an incoming RF signal in a satellite communications system, the RF signal normally assuming a continuous signal and being changed to a burst signal when voice activated, the arrangement being provided in an earth station and featuring: first means, the first means down-converting the RF signal applied thereto, the first means including a first variable attenuator and generating an IF signal; second means, the second means being coupled to the first means and demodulating the IF signal, the second means including a second variable attenuator, the second means outputting an AGC signal indicative of a signal level relating to the IF signal; and third means, the third means being coupled to the first and second means, the third means routing the AGC signal to the first variable attenuator and applying a constant potential to the second variable attenuator in the event that the RF signal is a continuous signal, the third means retaining a value of the AGC signal at the time when the RF signal is changed to the burst signal and applying the retained value of the AGC signal to the first variable attenuator, the third means allowing the AGC signal to be applied to the second variable attenuator while the RF signal is received in the form of the burst signal.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

A preferred embodiment of this invention will be discussed with reference to FIGS. 2 and 3.

Figure 1:
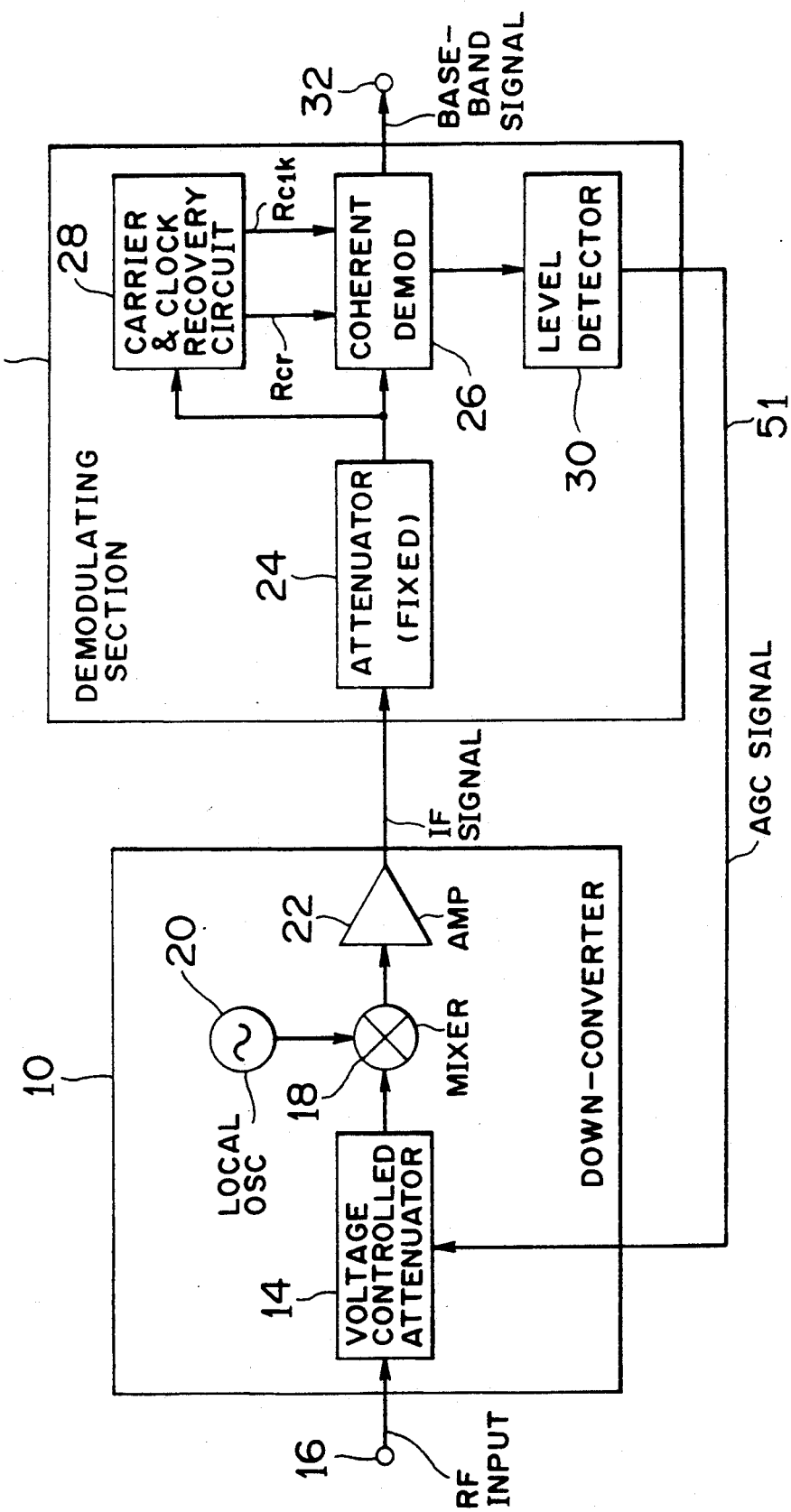
FIG. 1 is a block diagram schematically illustrating a conventional arrangement for demodulating a RF signal in a digital satellite communications system, discussed in the opening paragraphs of the instant specification.
Figure 2:
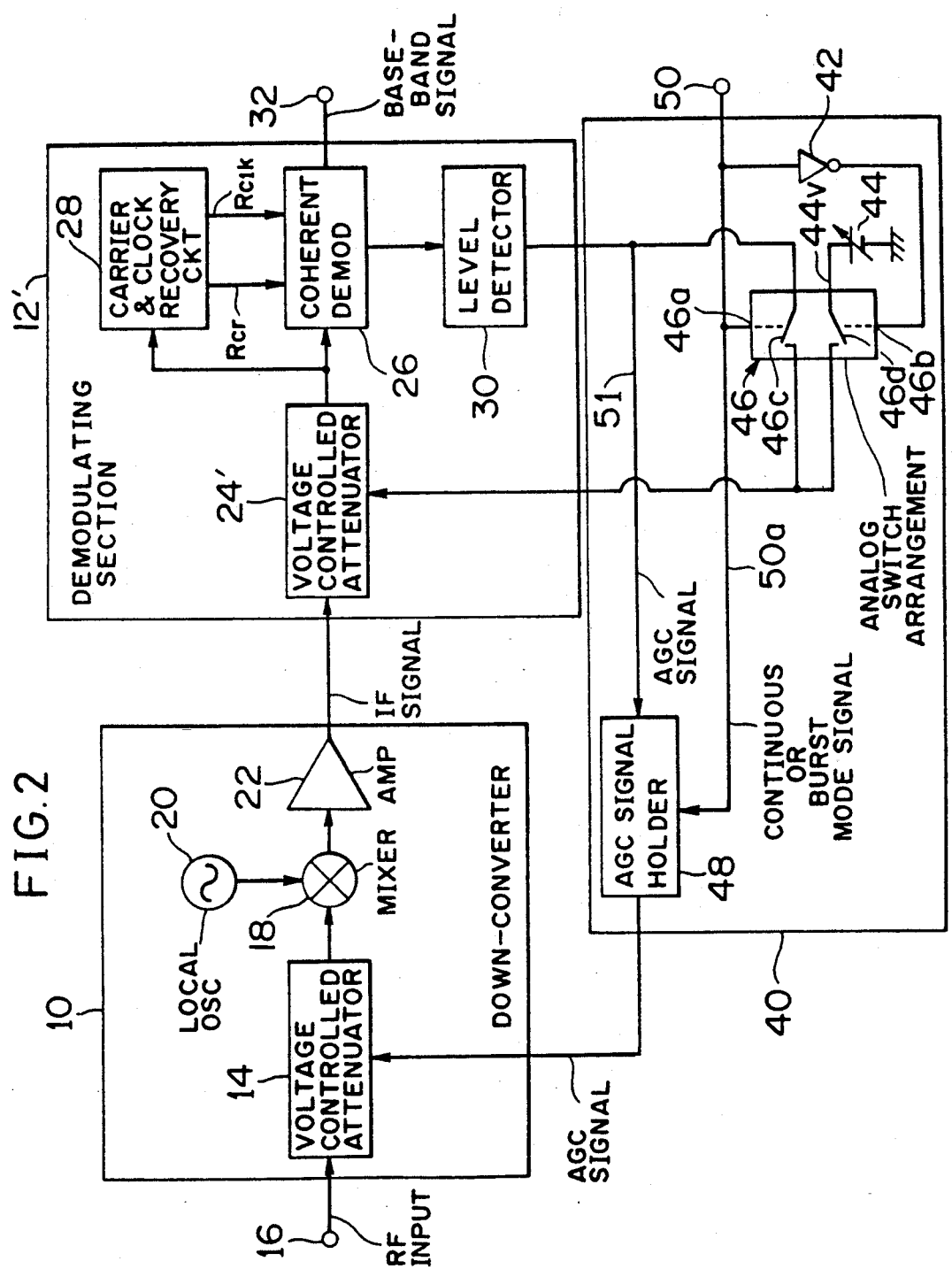
FIG. 2 is a block diagram illustrating an demodulating arrangement according to the present invention.

The arrangement of FIG. 2 differs from that of FIG. 1 in that: (a) the former arrangement is provided with a control circuit 40; and (b) a demodulating section 12' of the former arrangement includes a voltage controlled attenuator 24' in lieu of its counterpart 24 of the latter arrangement.

The control circuit 40 comprises an invertor 42, a constant voltage source 44 whose output voltage 44v is adjustable, an analog switch arrangement 46, and an AGC signal holder 48. One of two control terminals of the switch 46 (viz., 46a in this case) is supplied with a mode signal 50a (viz., continuous or burst mode signal) through a terminal 50, while the other control terminal 46b receives the output of the invertor 42. The mode signal 50a is applied from a controller (not shown) which detects occurrence of the voice activation between the earth stations associated with the FIG. 2 arrangement.

When the mode signal 50a indicates the continuous mode, an upper switch 46c of the switch arrangement 46 is open while an lower switch 46d thereof is closed. This means that a constant voltage is applied to the variable attenuator 24'. In such a case the continuous mode signal renders the holding function of the AGC signal holder 48 inoperative and hence the AGC signal 51 is allowed to pass through the holder 48 and is applied to the attenuator 14. On the contrary, in the event that the burst mode signal appears at the terminal 50, the switches 46c and 46d are closed and open respectively. Accordingly, the AGC signal 51 is directly fed to the variable attenuator 24' via the switch 46c, in which case the AGC signal holder 48 maintains the voltage level of the AGC signal 51 approximately at the time when the continuous mode is changed to the burst mode. Thus, the attenuator 14 is supplied with a constant AGC signal.

Merely for the convenience of discussion, it is assumed that the mode signal 50a assumes logics "1" and "0" when the signal 50a exhibits the continuous and burst modes, respectively.

Before further discussion of the FIG. 2 arrangement, reference will be made to FIG. 3 which shows in detail an example of the AGC signal holder 48.

Figure 3:
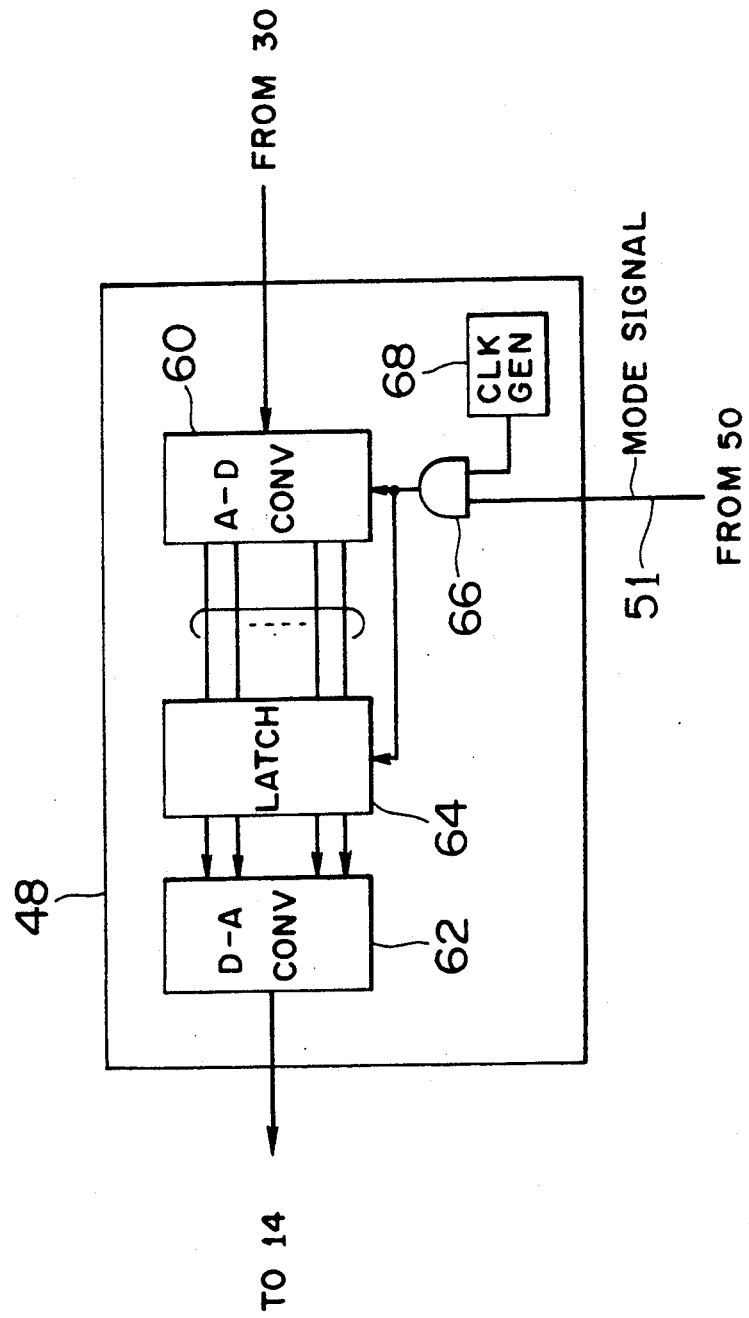
FIG. 3 is a block diagram showing in detail a portion of the FIG. 2 arrangement.

As shown in FIG. 3, the AGC signal holder 48 comprises an A-D converter 60, a D-A converter 62, a latch 64 provided between the two converters 60 and 62, an AND gate 66, and a clock generator 68. In the case where the AND gate 66 is supplied with the continuous mode signal assuming a logic "1", the gate 66 allows the timing clocks from the clock generator 68 to be applied to the A-D convertor 60 and also to the latch 64. It follows that the AGC signal 51 is applied from the level detector 30 to the voltage controlled attenuator 14 via the AGC signal holder 48, as in the FIG. 1 arrangement. On the other hand, when the voice activation mode is induced, the mode signal 50a assumes a logic "0". Thus, the application of the timing clocks to the blocks 60 and 64 is terminated and hence the latch 64 keeps the AGC signal therewithin approximately at the time when the continuous mode is changed to the burst mode.

Returning to FIG. 2, the constant voltage 44v is previously determined such that if the down-converter 10 issues a reference (viz., expected or predetermined) IF signal, the demodulating section 12 outputs a reference (viz., expected or predetermined) demodulated signal. As previously mentioned, the voltage controlled attenuator 14 has a wide dynamic range, it is understood that the down-converter 10 does not fail to produce the reference IF signal in the continuous signal mode even if the incoming RF signal exhibits the aforesaid level changes and also even if the burst interval deviations occur.

In the event that the continuous mode is changed to the burst mode, the AGC signal 51 applied to the attenuator 14 assumes a constant level. The AGC signal 51 with the constant level has been used to compensate for the level variations of the incoming RF signal in the continuous mode. Accordingly, the down-converter 10 continues to generate the reference IF signal even if the mode is changed to the burst one. Thus, the demodulating section 12' is also able to produce the reference or correct baseband signal in terms of the incoming RF signal's level changes.

As referred to in the above, the AGC signal 51 is also applied to the attenuator 24' which has a narrow dynamic range and hence the AGC loop comprising the blocks 24', 26, 30 and 46 exhibits a quick response. Resultantly, even if the bust interval deviation exists, each of the bursts included in the IF signal is effectively demodulated from the beginning thereof.

While the foregoing description describes one embodiment according to the present invention, the various alternatives and modifications possible without departing from the scope of the present invention, which is limited only by the appended claims, will be apparent to those skilled in the art.

What is claimed is:

1. An arrangement for demodulating an incoming RF signal in a satellite communications system, said RF signal normally assuming a continuous signal and being changed to a burst signal when voice activated, said arrangement being provided in an earth station and comprising:

first means, said first means down-converting said RF signal applied thereto, said first means including a first variable attenuator and generating an IF signal;

second means, said second means being coupled to said first means and demodulating said IF signal, said second means including a second variable attenuator, said second means outputting an AGC signal indicative of a signal level relating to said IF signal; and third means, said third means being coupled to said first and second means, said third means routing said AGC signal to said first variable attenuator and applying a constant potential to said second variable attenuator in the event that said RF signal is a continuous signal, said third means retaining a value of said AGC signal at the time when said RF signal is changed to the burst signal and applying the retained value of said AGC signal to said first variable attenuator, said third means allowing said AGC signal to be applied to said second variable attenuator while said RF signal takes the form of the burst signal.

2. An arrangement as claimed in claim 1, wherein said third means receiving a mode signal which assumes first and second levels, said first level indicating that said RF signal is the continuous signal while said second level indicates that said RF signal is the burst signal, said third means comprises:

a switch, said switch being coupled to said second means and receiving said AGC signal, said switch applying the constant potential to said second variable attenuator in response to said first level, said switch relaying said AGC signal to said second variable attenuator in response to said second level; and an AGC signal holder, said AGC signal holder being coupled to said first and second means and allowing said AGC signal to be applied to said first variable attenuator in response to said first level, said AGC signal holder retaining said AGC signal in response to said second level.

* * * * *